US009977185B2

(12) United States Patent
Budd et al.

(10) Patent No.: US 9,977,185 B2
(45) Date of Patent: May 22, 2018

(54) INTEGRATION OF BONDED OPTOELECTRONICS, PHOTONICS WAVEGUIDE AND VLSI SOI

(71) Applicant: INTERNATIONAL BUSINESS MACHINES CORPORATION, Armonk, NY (US)

(72) Inventors: Russell A. Budd, North Salem, NY (US); Effendi Leobandung, Stormville, NY (US); Ning Li, White Plains, NY (US); Jean-Olivier Plouchart, New York, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days. days.

(21) Appl. No.: 15/347,046

(22) Filed: Nov. 9, 2016

(65) Prior Publication Data

US 2017/0123153 A1    May 4, 2017

Related U.S. Application Data

(62) Division of application No. 14/925,664, filed on Oct. 28, 2015.

(51) Int. Cl.
*G02B 6/00* (2006.01)
*G02B 6/12* (2006.01)
(Continued)

(52) U.S. Cl.
CPC ..... *G02B 6/12004* (2013.01); *G02B 6/12002* (2013.01); *G02B 6/122* (2013.01); *G02B 6/132* (2013.01); *G02B 6/4201* (2013.01);
*G02B 6/428* (2013.01); *H01L 31/02161* (2013.01); *H01L 31/1035* (2013.01); *H01L 31/184* (2013.01); *H01L 31/1828* (2013.01); *G02B 2006/12121* (2013.01); *G02B 2006/12123* (2013.01); *G02B 2006/12176* (2013.01)

(58) Field of Classification Search
None
See application file for complete search history.

(56) References Cited

U.S. PATENT DOCUMENTS 6,455,398 B1    9/2002    Fonstad, Jr. et al.
6,633,699 B1    10/2003   Legay et al.
(Continued)

OTHER PUBLICATIONS

List of IBM Patents or Patent Applications Treated as Related dated Nov. 10, 2016, 2 pages.
Office Action issued in U.S. Appl. No. 15/347,131 dated Sep. 25, 2017, pp. 1-12.
(Continued)

*Primary Examiner* — Chad H Smith
(74) *Attorney, Agent, or Firm* — Tutunjian & Bitetto, P.C.; Louis J. Percello

(57) ABSTRACT

An optoelectronic device includes an integrated circuit including electronic devices formed on a front side of a semiconductor substrate. A barrier layer is formed on a back side of the semiconductor substrate. A photonics layer is formed on the barrier layer. The photonics layer includes a core for transmission of light and a cladding layer encapsulating the core and including a different index of refraction than the core. The core is configured to couple light generated from a component of the optoelectronic device.

13 Claims, 8 Drawing Sheets

(51) Int. Cl.
    *G02B 6/122*    (2006.01)
    *G02B 6/42*     (2006.01)
    *H01L 31/0216*  (2014.01)
    *H01L 31/103*   (2006.01)
    *H01L 31/18*    (2006.01)
    *G02B 6/132*    (2006.01)

(56) References Cited

U.S. PATENT DOCUMENTS

| | | |
|---|---|---|
| 7,897,428 B2 | 3/2011 | Assefa et al. |
| 7,955,887 B2 | 6/2011 | Assefa et al. |
| 8,426,921 B2 | 4/2013 | Assefa et al. |
| 8,472,494 B2 | 6/2013 | Akiyama |
| 8,709,938 B2 | 4/2014 | Enquist et al. |
| 8,718,480 B2 | 5/2014 | Snyman |
| 8,731,346 B2 | 5/2014 | Tseng et al. |
| 8,901,576 B2 | 12/2014 | Doany et al. |
| 8,912,017 B2 | 12/2014 | El-Ghoroury et al. |
| 2002/0039464 A1* | 4/2002 | Yoshimura et al. ..... G02B 6/10 385/14 |
| 2002/0172464 A1 | 11/2002 | Delwala |
| 2012/0250714 A1 | 10/2012 | Ohira et al. |
| 2013/0181233 A1* | 7/2013 | Doany .............. H01L 21/76251 257/88 |
| 2015/0099328 A1 | 4/2015 | Fitzgerald |

OTHER PUBLICATIONS

Office Action issued in U.S. Appl. No. 15/347,314 dated Jun. 7, 2017 pp. 1-11.

\* cited by examiner

INTEGRATION OF BONDED OPTOELECTRONICS, PHOTONICS WAVEGUIDE AND VLSI SOI

BACKGROUND

Technical Field

The present invention relates to optoelectronic integration with very large scale integration (VLSI) devices, and more particularly to systems, devices and methods for integrating optoelectronics and waveguides on a backside of integrated circuit chips.

Description of the Related Art

Field effect transistors (FET) for very large scale integration (VLSI) are formed on a semiconductor substrate. While photonics devices often work with VLSI FETs, integration of photonics functions with VLSI structures requires use of valuable chip space or "real estate". The photonics waveguides are usually integrated in a substrate layer (e.g., Si layer) that is also employed for Si transistors. This complicates the VLSI design and processing.

SUMMARY

An optoelectronic device includes an integrated circuit including electronic devices formed on a front side of a semiconductor substrate. A barrier layer is formed on a back side of the semiconductor substrate. A photonics layer is formed on the barrier layer. The photonics layer includes a core for transmission of light and a cladding layer encapsulating the core and including a different index of refraction than the core. The core is configured to couple light generated from a component of the optoelectronic device.

Another optoelectronic device includes an integrated circuit including electronic devices formed on a front side of a semiconductor substrate. A light emitting device is connected to at least one of the electronic devices. A barrier layer is formed on a back side of the semiconductor substrate. A photonics layer is formed on the barrier layer. The photonics layer includes a core for transmission of light and a cladding layer encapsulating the core and including a different index of refraction than the core. The core is configured to couple light generated by the light emitting device.

A method for fabricating an optoelectronic device includes forming a barrier layer on a back side of a semiconductor substrate, a front side of the semiconductor substrate including an integrated circuit including electronic devices; and forming a photonics layer on the barrier layer, the photonics layer including a core for transmission of light and a cladding layer encapsulating the core and including a different index of refraction than the core, the core configured to couple light generated from at least one component of the optoelectronic device.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
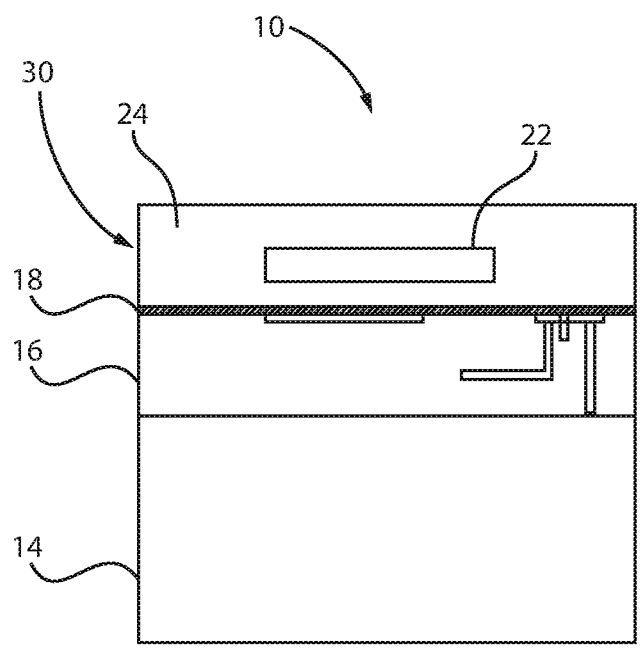
FIG. 1 is a cross-sectional view of an optoelectronic device having a photonics layer formed on a thin barrier layer on an opposite side of an integrated circuit and including a waveguide having a core floating in a cladding layer in accordance with the present principles.

In accordance with the present principles, devices and methods are provided that include photonic elements, such as e.g., waveguides, etc. that are integrated with an integrated circuit (IC) but on a backside or over a front side of the IC. This saves real-estate for very large scale integration (VLSI) circuits. The back side (or front side) of the IC may be processed so as to not interfere with metallization structures for off-chip electrical connections.

In useful embodiments, VLSI semiconductor-on-insulator (SOI) technology may be employed with a thin silicon oxide ($SiO_2$) layer barrier having a thickness T less than a light wavelength ($\lambda$) of the light transmitted. A low refractive index layer needs to be deposited first (silicon oxide) to isolate a waveguide core from the VLSI circuitry. In other useful embodiments, a thick silicon oxide ($SiO_2$) layer may be employed as a barrier having a thickness T greater than a light wavelength ($\lambda$) of the light transmitted. A core can be deposited on the barrier. The core includes a refractive index higher than 1.56 (if $SiO_2$ is employed as 1.56 is the refractive index of $SiO_2$).

The core or cores may be formed in or with a cladding layer. Other photonics components, connections and support circuitry may be located on the back (or front) of the IC along with the waveguide(s). The photonics components, though not being integrated directly with VLSI circuitry, remain close and in many cases are closer to VLSI components on the IC than in conventional structures.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a cross-sectional view of a chip package 10 fabricated for transfer and having photonics and VLSI circuitry is shown in accordance with one illustrative embodiment. A temporary mechanical substrate 14 may include glass, quartz, Si, sapphire or any other suitable material employed to build and/or transfer the chip package 10. An integrated circuit (IC) chip 16 is adhered to the mechanical substrate 14. The IC chip 16 may include any integrated circuit components including a VLSI array, processors, memory, photonic processing circuitry, etc.

A photonic waveguide layer 30 is integrated with the chip package by forming the photonic waveguide layer 30 on a backside of the IC chip 16 to save real-estate for VLSI circuits on the chip 16. The photonic waveguide layer 30 includes a core 22. Core 22 guides light therethrough and includes a high index of refraction relative to a cladding layer 24. The core 22 may include a polymer, SiN or other waveguide materials. The cladding layer 24 may include any low index dielectric, $SiO_2$, polymer, porous materials, etc.

The photonic waveguide layer 30 is separated from the IC chip 16 by a barrier layer 18. The barrier layer 18 may include a thin layer of $SiO_2$ (the thickness of the layer 18 should be less than the light wavelength ($\lambda$) to be transmitted by the core 22). The low refractive index layer or cladding 24 is deposited on the barrier layer 18 followed by the formation/deposition and patterning of the core 22. Then, more cladding 24 is formed to encapsulate the core 22. The barrier layer 18 isolates the core 22 from the VLSI circuits of the IC chip 16.

Figure 2:
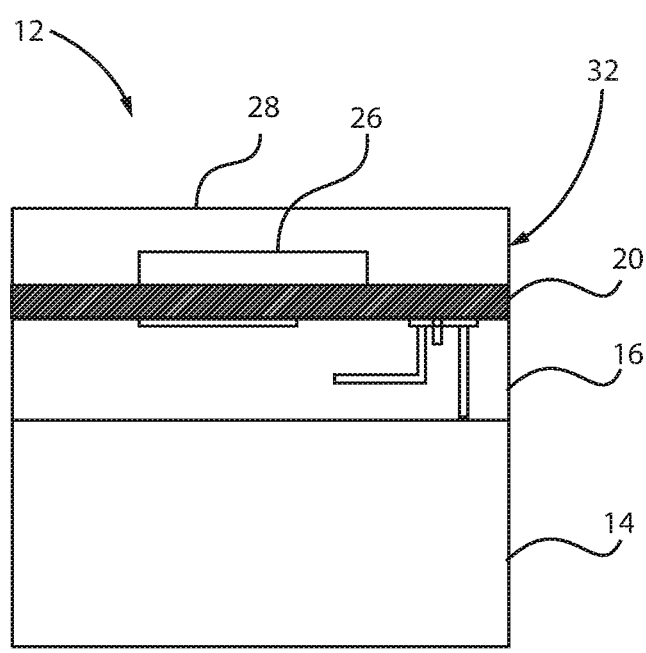
FIG. 2 is a cross-sectional view of an optoelectronic device having a photonics layer formed on a thick barrier layer on an opposite side of an integrated circuit and including a waveguide having a core in contact with the barrier layer in accordance with the present principles.

Referring to FIG. 2, a cross-sectional view of a chip package 12 fabricated for transfer and having photonics and VLSI circuitry is shown in accordance with another illustrative embodiment. The temporary mechanical substrate 14 may include glass, quartz, Si, sapphire or any other suitable material employed to build and/or transfer the chip package 12. IC chip 16 is adhered to the mechanical substrate 14. The IC chip 16 may include any integrated circuit components including a VLSI array, processors, memory, photonic processing circuitry, etc.

A photonic waveguide layer 32 is integrated with the chip package by forming the photonic waveguide layer 32 on a backside of the IC chip 16 to save real-estate for VLSI circuits on the chip 16. The photonic waveguide layer 32 includes a core 26. Core 26 guides light therethrough and includes a high index of refraction relative to a cladding layer 28. The core 26 may include a polymer, SiN or other waveguide materials. The cladding layer 28 may include any low index dielectric, $SiO_2$, polymer, porous materials, etc.

The photonic waveguide layer 32 is separated from the IC chip 16 by a barrier layer 20. The barrier layer 20 may include a thick layer of $SiO_2$ (the thickness of the layer 18 should be greater than the light wavelength ($\lambda$) to be transmitted by the core 26). Formation/deposition and patterning of the core 26 is performed on the barrier layer 20 followed by cladding 28, which is deposited and encapsulates the core 26. The barrier layer 20 isolates the core 26 from the VLSI circuits of the IC chip 16. The core refractive index needs to be higher than the material for the barrier layer 20, e.g., greater than 1.56 if $SiO_2$ is employed as the barrier layer 20. Other materials may be employed for the barrier layers 18 and 20.

Figure 3:
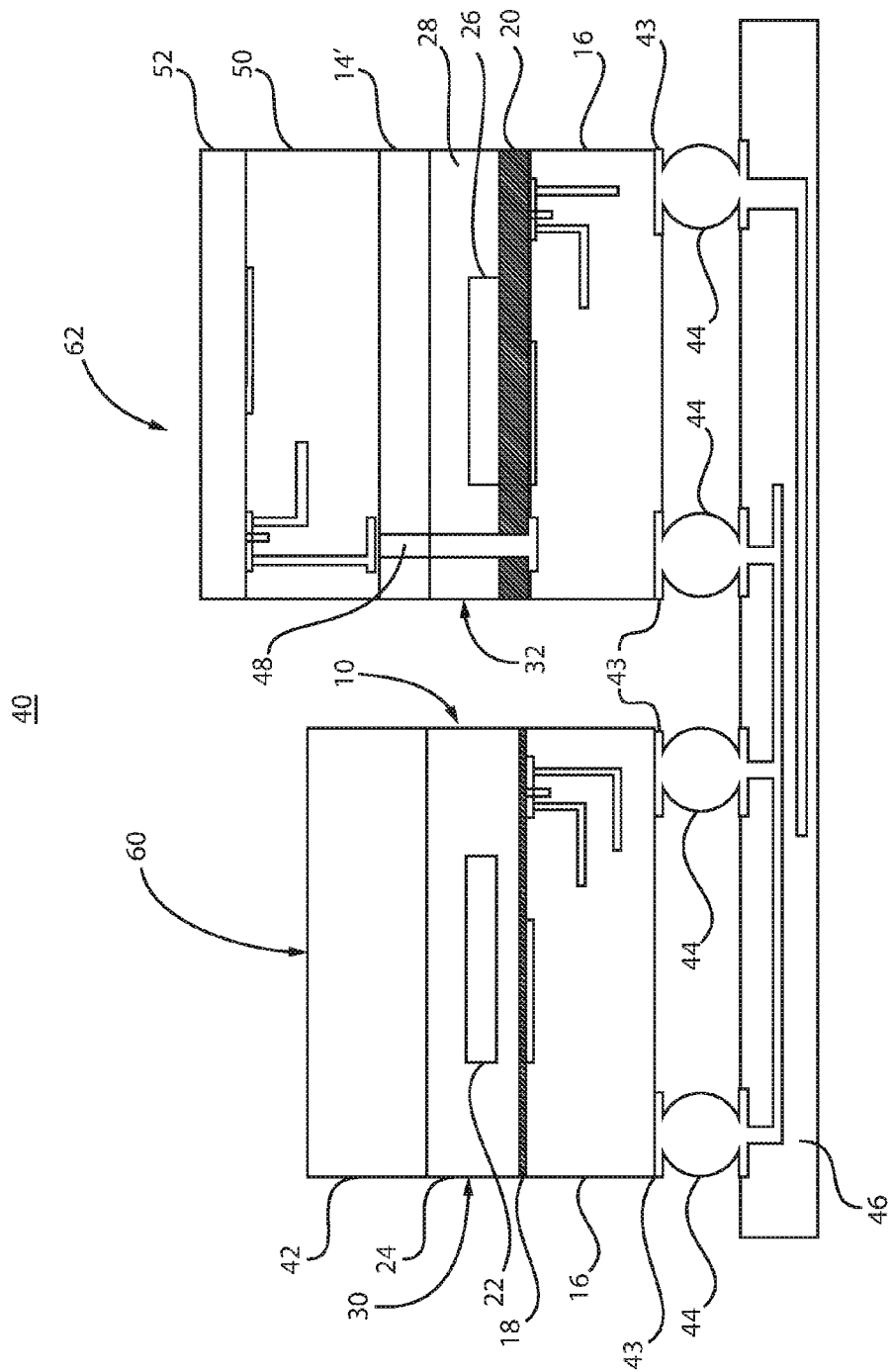
FIG. 3 is a cross-sectional view of an optoelectronic device having the optoelectronic devices of FIG. 1 and FIG. 2 coupled to a platform with the optoelectronic device of FIG. 2 including a through via to connect to an additional integrated circuit in accordance with the present principles.

Referring to FIG. 3, the package 30 is transferred to another mechanical substrate 42 and flipped. The mechanical substrate 14 is removed to expose the IC chip 16 to form a subassembly 60. The subassembly 60 is positioned and bonded to a printed wiring board 46 or other platform using solder balls 44 (C4) or other connections. The mechanical substrate 42 may include Si, glass, sapphire, etc. and is bonded to the cladding 24 using an adhesive or the like. Instead of another mechanical substrate, other substrates, layers or stacks of layers may be employed.

As shown for a subassembly 62, a mechanical substrate 14' is reduced by polishing or etching. A through via or vias 48 are formed therethrough. Another IC chip 50 with a substrate 52 may be bonded to the mechanical substrate 14' and be electrically connected to the IC chip 16 using vias 48. The subassembly 62 is positioned and bonded to the printed wiring board 46 or other platform using the solder balls 44 or other connections. It should be understood that photonics layers and IC layers may be stacked in any combination for three dimensional (3D) integration.

The IC chips 16 include an open front-side available for C4 connections 44, and can then be attached to the board 46 or Si carrier. The IC chips 16 may have pads or connections 43 formed thereon to connect to solder balls 44 or other connection points.

It should be noted that any device may be connected to the through via or vias 48. This may include a single component or an entire chip.

Figure 4:
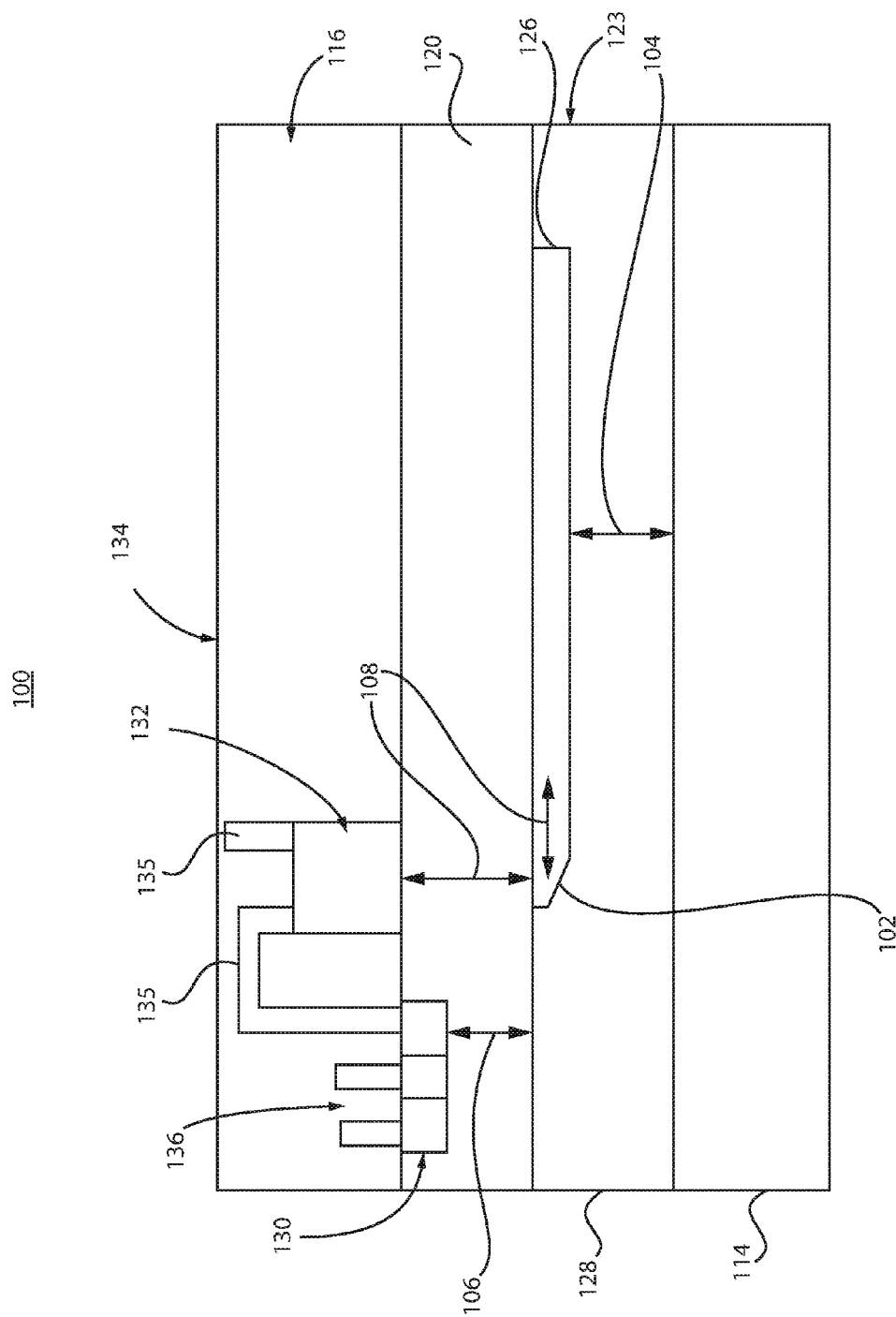
FIG. 4 is a cross-sectional view of an optoelectronic device having a light emitting device bonded to a front side of an integrated circuit and a photonics layer with a core and a mirror to redirect light from the light emitting device in accordance with the present principles.

Referring to FIG. 4, another embodiment includes a stacked device 100 with an IC chip 130 having III-V devices formed thereon or bonded thereto. The IC chip 130 may be formed on a SOI substrate or bulk substrate. The IC chip 130 may include a light generating or emitting device 132 formed from the III-V material. The light emitting device 132 may be part of another IC chip 116 or be a portion of a III-V substrate bonded to the IC chip 130. The IC chip 130 extends across the device 100 (or a portion thereof in this and other embodiments described herein) and has a barrier layer 120 formed on its back side. The barrier layer 120 occupies thickness 106. The light emitting device 132 may include a diode or a laser, e.g., a vertical-cavity surface-emitting laser (VCSEL) or diode.

The IC chip 116 may be bonded to another IC chip 130 having transistors 136 (FET) or other VLSI circuits formed thereon. The barrier layer 120 is formed on the IC chip 130. The FET 136 of the IC chip 130 may be employed to drive the light emitting device 132 on the IC chip 116. Metallizations 135 may be employed to make connections between the FET 136 and the light emitting device 132. The barrier layer 120 may include $SiO_2$, although other materials may be employed. The IC chip 116 may include a dielectric material with a dielectric constant of between 2-4 if $SiO_2$ is employed for the barrier layer 120 ($SiO_2$ has a dielectric constant of about 3.9). A thickness 106 of the barrier layer is greater than the wavelength of light 108 emitted from the light emitting device 132 and traveling in the core 126.

When joining the IC chips 116 and 130 with a photonics layer 123, the light emitting device or devices 132 are aligned with the core 126 to couple light 108 into the core 126. The core 126 includes a mirror 102. e.g., 45 degrees, to reflect light along a longitudinal direction in the core 126. The vertical light emitting device 132 takes up less circuit area real-estate than a planar device, but the mirror 102 is needed to direct light 108 from vertical to horizontal.

Cladding 128 includes a thickness 104 of greater than the wavelength of light. A mechanical substrate 114 is employed to form the stack of components and to transfer the device 100 to another substrate or platform. The IC chip 116 includes an open (unblocked) top surface 134 for connecting to C4 connections.

Figure 5:
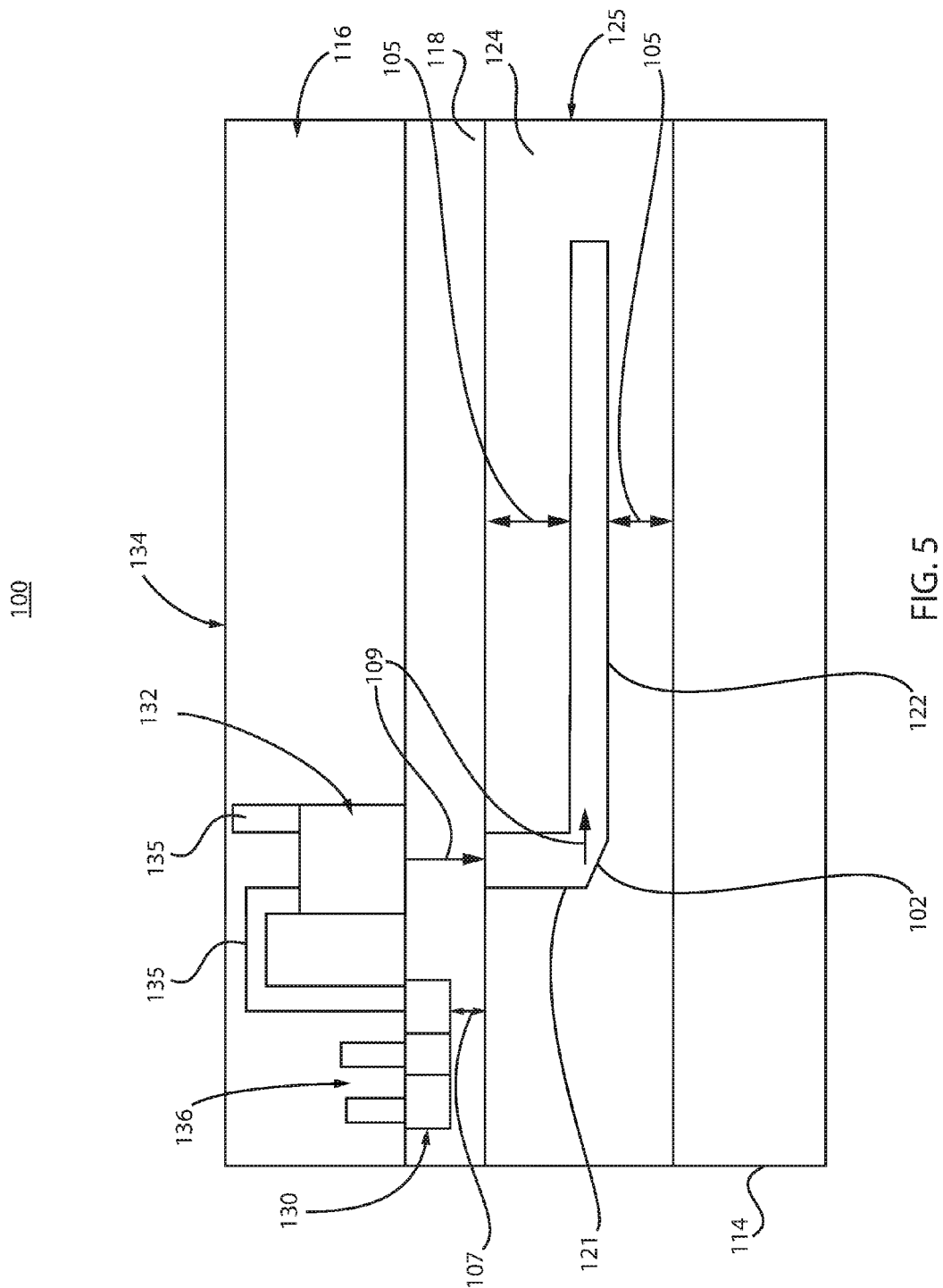
FIG. 5 is a cross-sectional view of an optoelectronic device having a light emitting device bonded to a front side of an integrated circuit and a photonics layer with a core, a transverse portion and a mirror to redirect light from the light emitting device in accordance with the present principles.

Referring to FIG. 5, another embodiment includes a stacked device 110 with an IC chip 130 having III-V devices formed thereon. The IC chip 130 may be formed on a SOI substrate or bulk substrate. The IC chip 130 may include a light generating or emitting device 132 formed from the III-V material. The light emitting device 132 may be part of another IC chip 116 or be a portion of a III-V substrate bonded to the IC chip 130. The light emitting device 132 may include a photodiode or a laser. The IC chip 130 extends across the device 100 and has a barrier layer 118 formed on its back side. The barrier layer 118 occupies thickness 107.

The IC chip 116 may be bonded to another IC chip 130 having transistors 136 (FET) or other VLSI circuits formed thereon. The barrier layer 118 is formed on the IC chip 130. The FET 136 of the IC chip 130 may be employed to drive the light emitting device 132 on the IC chip 116. The barrier layer 118 may include $SiO_2$, although other materials may be employed. The IC chip 116 may include a dielectric material with a dielectric constant of between 2-4 if $SiO_2$ is employed for the barrier layer 118 ($SiO_2$ has a dielectric constant of about 3.9). A thickness 107 of the barrier layer is less than the wavelength of light 109 emitted from the light generating device 132 and traveling in a core 122.

When joining the IC chips 116 and 130 with a photonics layer 125, the light emitting device or devices 132 are aligned with the core 122 to couple light 109 into the core 122. The core 122 includes a transverse portion 121 and a mirror 102, e.g., 45 degrees, to couple and reflect light along a longitudinal direction in the core 122. The vertical light emitting device 132 takes up less circuit area real-estate than a planar device, but the mirror 102 is needed to direct light 108 from vertical to horizontal.

Cladding 124 includes thicknesses 105 of greater than the wavelength of light. The mechanical substrate 114 is employed to form the stack of components and to transfer the device to another substrate or platform. The IC chip 116 includes an open (unblocked) top surface 134 for connecting to C4 connections.

Figure 6:
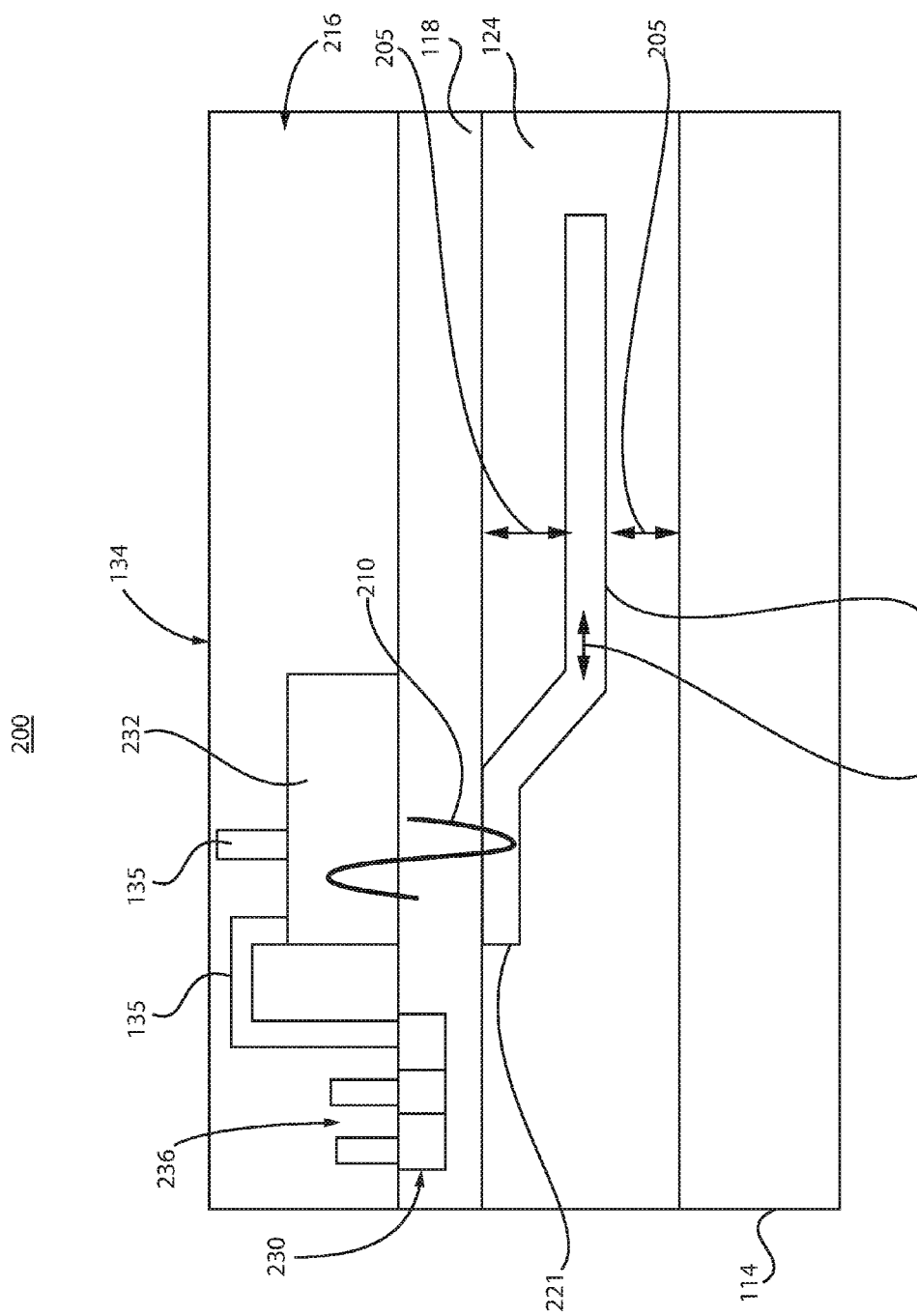
FIG. 6 is a cross-sectional view of an optoelectronic device having a light emitting device bonded to a front side of an integrated circuit and a photonics layer with a core with a coupling portion to redirect evanescent light from the light emitting device in accordance with the present principles.

Referring to FIG. 6, another embodiment includes a stacked device 200 with an IC chip 230 having III-V devices formed thereon. The IC chip 230 may be formed on a SOI substrate or bulk substrate. The IC chip 230 extends across the device 200 and has a barrier layer 118 formed on its back side. The IC chip 230 may include a light generating or emitting device 232 formed from the III-V material. The light emitting device 232 may be part of another IC chip 216 or be a portion of a III-V substrate bonded to the IC chip 230.

The light emitting device 232 may include a photodiode or a laser. The IC chip 216 may be bonded to another IC chip 230 having transistors 236 (FET) or other VLSI circuits formed thereon. The barrier layer 118 is formed on the IC chip 230. The FET 236 of the IC chip 230 may be employed to drive the light generating device 232 on the IC chip 216. The barrier layer 118 may include $SiO_2$, although other materials may be employed. The IC chip 216 may include a dielectric material with a dielectric constant of between 2-4 if $SiO_2$ is employed for the barrier layer 118 ($SiO_2$ has a dielectric constant of about 3.9). A thickness of the barrier layer is less than a wavelength of light 212 emitted from the light emitting device 232 and traveling in a core 222.

In this embodiment, the core 222 includes a portion 221 in contact with the barrier layer 118 and close to the light emitting device 232 for evanescent light coupling. The light emitting device or devices 232 are aligned with a position of the core 222 to couple light 210 into the core 222 through evanescent coupling. The core 222 includes an angled portion 221 to redirect light 212 along a longitudinal direction in the core 222. The vertical light emitting device 232 takes up less circuit area real-estate than a planar device, but the core 222 is shaped to direct light 210 to a horizontal direction.

Cladding 124 includes thicknesses 205 of greater than the wavelength of light. The mechanical substrate 114 is employed to form the stack of components and to transfer the device to another substrate or platform. The IC chip 216 includes an open (unblocked) top surface 134 for connecting to C4 connections of a carrier or board.

Figure 7:
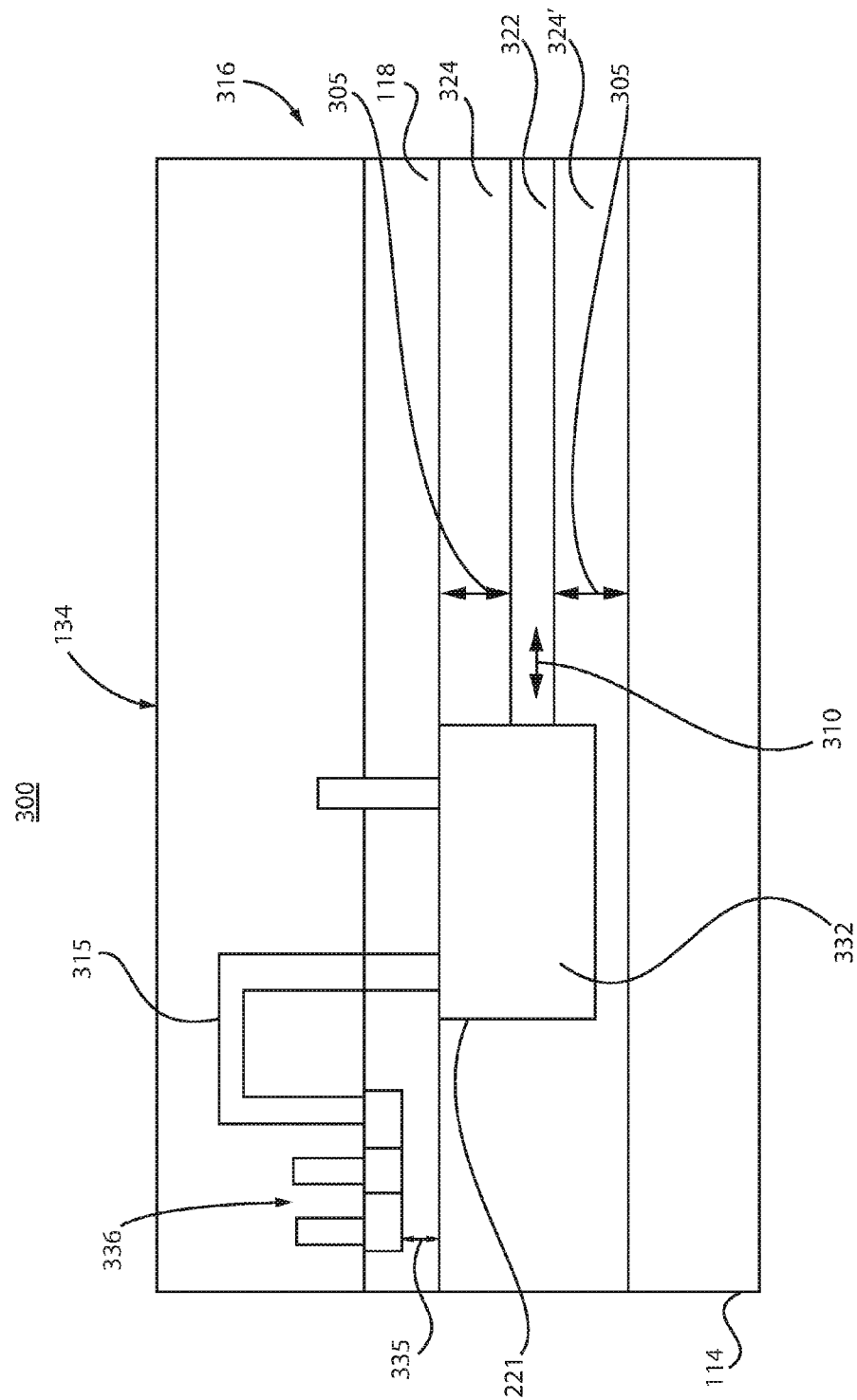
FIG. 7 is a cross-sectional view of an optoelectronic device having a light emitting device bonded to a barrier layer on a back side of an integrated circuit within a photonics layer, which includes a core aligned with the light emitting device to direct light in accordance with the present principles.

Referring to FIG. 7, another embodiment includes a stacked device 300 with an IC chip 316. The IC chip 316 may be formed on a SOI substrate or bulk substrate. The IC chip 316 extends across the device 300. A barrier layer 118 may be formed on a back surface of the IC chip 316. The barrier layer 118 occupies thickness 335.

A light generating or emitting device 332 may be formed from III-V material or other material and is bonded to the barrier layer 118. The light emitting device 332 may include a photodiode or a laser. The IC chip 316 may include transistors 336 (FETs) or other VLSI circuits and metallizations 315 formed thereon.

The FET 336 of the IC chip 316 may be employed to drive the light generating device 332. Metallizations 315 may pass through the barrier layer 118 to make connections with the light generating device 332. After placing the light emitting device 332 on the barrier layer 118, a first portion of the cladding layer 324 is formed followed by the formation of a core 322. The core 322 is aligned with the light output of the light emitting device 332. Another portion of the cladding layer 342' is then formed over the core 322. The light emitting device or devices 332 are aligned with the core 322 to couple light 310 into the core 322. The core 322 may direct light off-chip or to other devices on the device 300 (e.g., using transverse portions, not shown). The light emitting device 332 takes up no real-estate on the IC 316.

Cladding 324, 324' includes thicknesses 305 of greater than the wavelength of light employed. The mechanical substrate 114 is employed to form the stack of components and to transfer the device to another substrate or platform. The IC chip 316 includes an open (unblocked) top surface 134 for connecting to C4 connections.

The barrier layer 118 may include $SiO_2$, although other materials may be employed. A thickness 335 of the barrier layer 118 may be greater than 0.1 micron and is compatible with buried oxides in SOI devices (e.g., approximately 0.15 microns in thickness).

Figure 8:
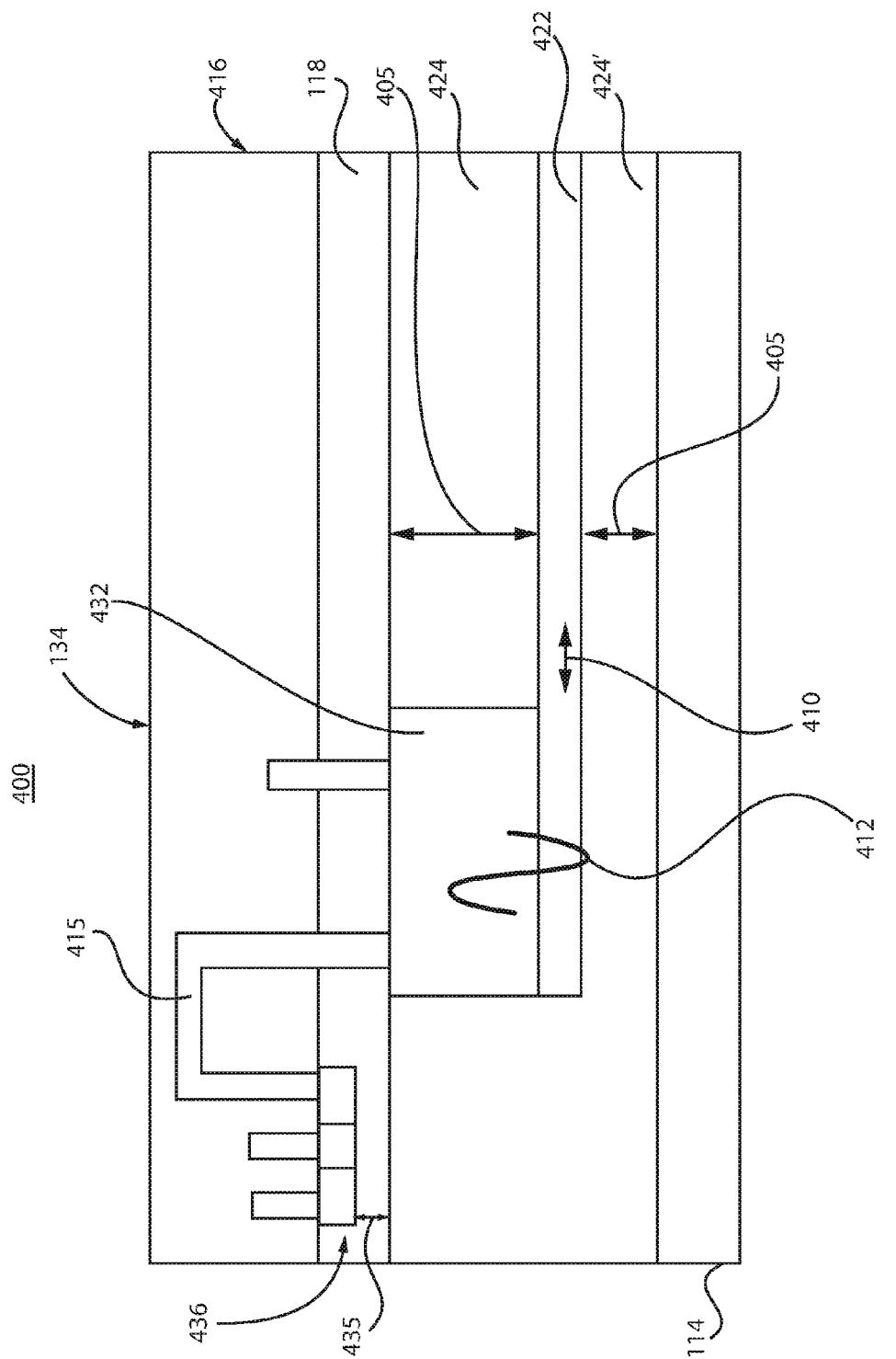
FIG. 8 is a cross-sectional view of an optoelectronic device having a light emitting device bonded to a barrier layer on a back side of an integrated circuit within a photonics layer, which includes a core aligned with the light emitting device to direct evanescent light in accordance with the present principles.

Referring to FIG. 8, another embodiment includes a stacked device 400 with an IC chip 416. The IC chip 416 may be formed on a SOI substrate or bulk substrate. A barrier layer 118 is formed on a back surface of the IC chip 416. The IC chip 416 extends across the device 400. The barrier layer 118 occupies thickness 435.

A light generating or emitting device 432 may be formed from III-V material or other material and is bonded to the barrier layer 118. The light emitting device 432 may include a photodiode or a laser. The IC chip 416 may include transistors 436 (FETs) or other VLSI circuits and metallizations 415 formed thereon.

The FET 436 of the IC chip 416 may be employed to drive the light emitting device 432. Metallizations 415 may pass through the barrier layer 118 to make connections with the light emitting device 432. After placing the light emitting device 432 on the barrier layer 118, a first portion of the cladding layer 424 is formed followed by the formation of a core 422. The core 422 is formed on the light emitting device 432 to couple evanescent light 412 into the core 422. Another portion of the cladding layer 442' is then formed over the core 422. The light emitting device or devices 432 couple light 410 into the core 422. The core 422 may direct light off-chip or to other devices on the device 400 (e.g., using transverse portions, not shown). The light emitting device 432 takes up no real-estate on the IC 416.

Cladding 424, 424' includes thicknesses 405 of greater than the wavelength of light employed. The mechanical substrate 114 is employed to form the stack of components and to transfer the device to another substrate or platform. The IC chip 416 includes an open (unblocked) top surface 134 for connecting to C4 connections.

The barrier layer 118 may include $SiO_2$, although other materials may be employed. A thickness 435 of the barrier layer 118 may be greater than 0.1 micron and is compatible with buried oxides in SOI devices (e.g., approximately 0.15 microns in thickness). The core 422 is close to the light emitting device 432 for efficient evanescent coupling. Evanescent coupling relaxes the alignment requirements between a planar optoelectronics device (432) and core 422.

It should be understood that the embodiments described may include a thin barrier layer or a thick barrier layer as needed. In addition, the ICs may include planar FETs, finFETs or any other device type.

Figure 9:
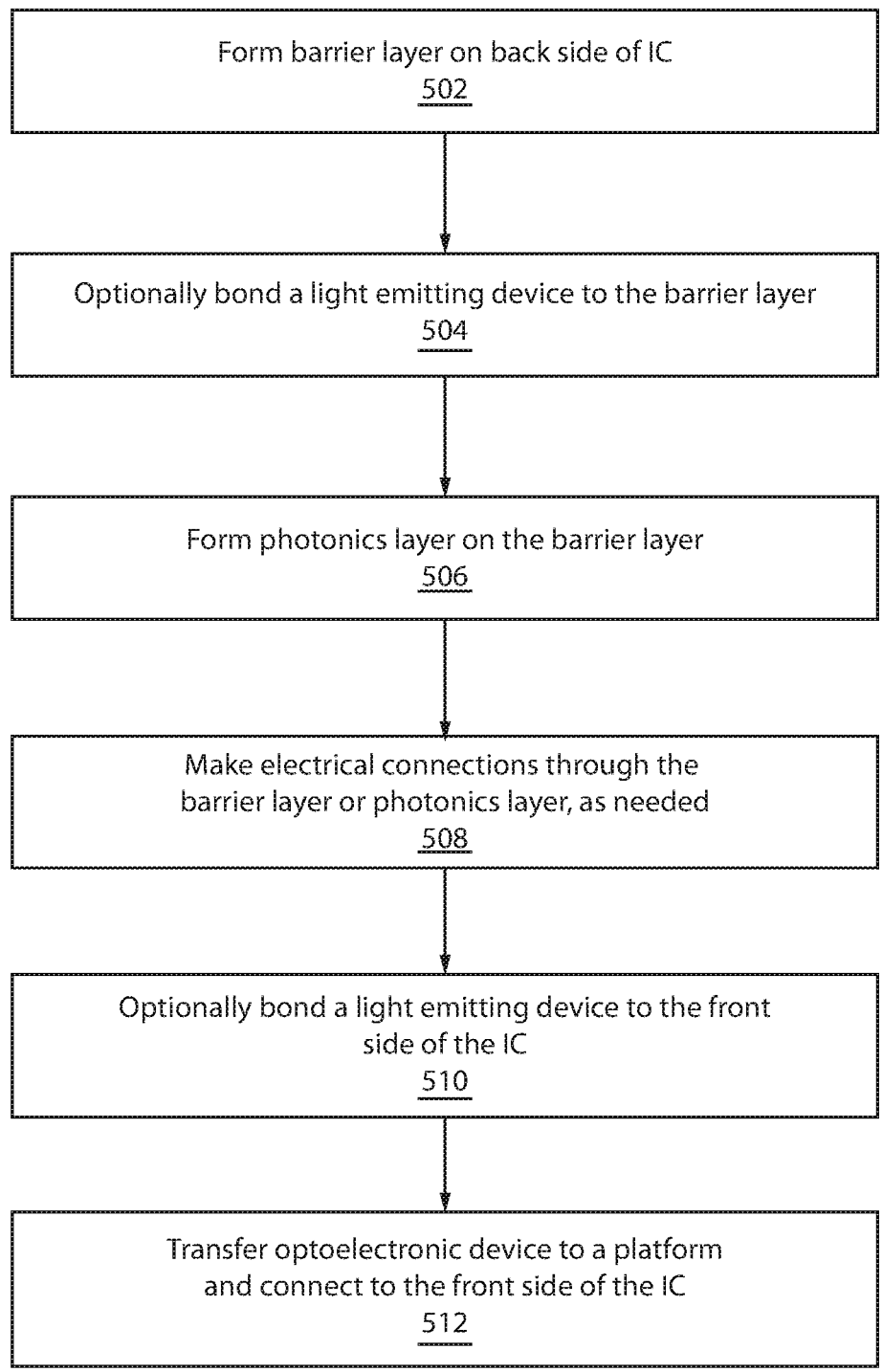
FIG. 9 is a block/flow diagram showing methods for fabricating of an optoelectronic device in accordance with illustrative embodiments.

Referring to FIG. 9, a method for fabricating an optoelectronic device is shown in accordance with illustrative embodiments. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 502, a barrier layer is formed on a back side of a semiconductor substrate. A front side of the semiconductor substrate includes an integrated circuit including electronic devices. Electronic device may include transistors (e.g., driving transistors, memory devices, etc.), electromagnetic emission devices or any other components that may be formed on an integrated circuit (metallizations, contacts, etc.). The barrier layer may include silicon oxide although other material may be employed.

In block 504, a light emitting device (e.g., photodiode or laser) may be bonded to the barrier layer and formed within the cladding to couple light into the core.

In block 506, a photonics layer is formed on the barrier layer. The photonics layer includes a core for transmission of light and a cladding layer encapsulating the core. The cladding includes a different index of refraction than the core. The core is configured to couple light generated from at least one component of the optoelectronic device, e.g., laser, photodiode, etc.

In one embodiment, the core may be formed directly on the barrier layer if the barrier layer includes a thickness greater than a wavelength of the light coupled in the core. In another embodiment, the cladding may be formed directly on the barrier layer, and the core is offset from the barrier layer within the cladding. The barrier layer in this instance may include a thickness of less than a wavelength of the light coupled in the core.

The photonics layer may sandwiched between the integrated circuit and at least one other electronic device. In block 508, connections may be formed through the barrier layer or through the photonics layer, e.g., a through via or vias may be formed through the photonics layer, to connect the integrated circuit to the at least one other electronic device (e.g., another IC, a light emitting device, a FET, etc.). In block 510, a light emitting device (e.g., photodiode or laser) may be bonded to the front side of the integrated circuit to couple light through the barrier layer and into the core.

The optoelectronic device may be bonded to one or more other devices using a transfer process. In block 512, the optoelectronic device is transferred to a platform (e.g., a board, carrier, other chip, etc.). The front side of the integrated circuit is preferably free to connect to the board or carrier. The connections may include pads and solder balls (C4 connections). In useful embodiments, the integrated circuit is bonded to a first mechanical substrate. After forming the barrier layer, a photonics layer is formed. Then, the photonics layer is bonded to a second mechanical substrate, and the first mechanical substrate is removed (exposing a front side of the integrated circuit). The front side of the integrated circuit is then connected to another device, board or carrier. The second mechanical substrate may remain or be removed.

Having described preferred embodiments from integration of bonded optoelectronics, photonics waveguide and VLSI SOI (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. An optoelectronic device, comprising:
   an integrated circuit including electronic devices and a semiconductor substrate, wherein the electronic devices are formed on a front side of the semiconductor substrate;
   a barrier layer formed on a back side of the semiconductor substrate, wherein the back side is opposite the front side; and
   a photonics layer formed on the barrier layer such that the barrier layer forms a barrier between the photonics layer and the semiconductor substrate, the photonics layer including a core for transmission of light and a cladding layer encapsulating the core and including a different index of refraction than the core, the core configured to couple light generated from at least one component of the optoelectronic device, wherein the cladding layer is formed on the barrier layer and the core is offset from the barrier layer within the cladding layer and the barrier layer includes a thickness of less than a wavelength of the light to be coupled in the core, wherein the light in the core is coupled directly across the barrier layer from the at least one component to the photonics layer.

2. The device as recited in claim 1, wherein the photonics layer is sandwiched between the integrated circuit and at least one other electronic device and includes a through via to connect the integrated circuit to the at least one other electronic device.

3. The device as recited in claim 1, wherein the front side of the integrated circuit is free to enable connection to a board or carrier.

4. The device as recited in claim 1, wherein the at least one electronic device includes a diode or laser bonded to the front side of the integrated circuit to couple light through the barrier layer and into the core.

5. An optoelectronic device, comprising:
   an integrated circuit including electronic devices and a semiconductor substrate, wherein the electronic devices are formed on a front side of the semiconductor substrate;
   a light emitting device connected to at least one of the electronic devices;
   a barrier layer formed on a back side of the semiconductor substrate, wherein the back side is opposite the front side; and
   a photonics layer formed on the barrier layer such that the barrier layer forms a barrier between the photonics layer and the semiconductor substrate, the photonics layer including a core for transmission of light and a cladding layer encapsulating the core and including a different index of refraction than the core, the core configured to couple light generated by the light emitting device, wherein the cladding layer is formed on the barrier layer and the core is offset from the barrier layer within the cladding layer and the barrier layer includes a thickness of less than a wavelength of the light to be coupled in the core, wherein the light in the core is coupled directly across the barrier layer from the light emitting device to the photonics layer.

6. The device as recited in claim 5, wherein the light emitting device includes a III-V substrate bonded to one of the front side of the integrated circuit or the barrier layer.

7. The device as recited in claim 5, wherein the photonics layer is connected to the integrated circuit through the barrier layer.

8. The device as recited in claim 5, wherein the front side of the integrated circuit is free to enable connection to a board or carrier.

9. The device as recited in claim 5, wherein the light emitting device includes a diode or laser that couples light through the barrier layer and into the core using one of a mirror or transverse portion.

10. The device as recited in claim 5, wherein the light emitting device includes a diode or laser that is formed on the barrier layer and couples light into the core.

11. A method for fabricating an optoelectronic device, comprising:
   forming a barrier layer on a back side of a semiconductor substrate of an integrated circuit, a front side of the semiconductor substrate including electronic devices, wherein the back side is opposite the front side; and
   forming a photonics layer on the barrier layer such that the barrier layer forms a barrier between the photonics layer and the semiconductor substrate, the photonics layer including a core for transmission of light and a cladding layer encapsulating the core and including a different index of refraction than the core, the core configured to couple light generated from at least one component of the optoelectronic device, wherein the cladding layer is formed on the barrier layer and the core is offset from the barrier layer within the cladding layer and the barrier layer includes a thickness of less than a wavelength of the light to be coupled in the core, wherein the light in the core is coupled directly across the barrier layer from the at least one component to the photonics layer.

12. The method as recited in claim 11, wherein the photonics layer is sandwiched between the integrated circuit and at least one other electronic device and the method further comprises forming a through via to connect the integrated circuit to the at least one other electronic device.

13. The method as recited in claim 11, further comprising transferring the optoelectronic device to a board or carrier front side and connecting the front side of the integrated circuit to the board or carrier.

* * * * *